(12) United States Patent
Zhu et al.

(10) Patent No.: US 8,304,831 B2
(45) Date of Patent: Nov. 6, 2012

(54) METHOD AND APPARATUS OF FORMING A GATE

(75) Inventors: Ming Zhu, Singapore (SG); Lee-Wee Teo, Singapore (SG); Han-Guan Chew, Singapore (SG); Harry Hak-Lay Chuang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 153 days.

(21) Appl. No.: 12/701,656

(22) Filed: Feb. 8, 2010

(65) Prior Publication Data

US 2011/0193161 A1 Aug. 11, 2011

(51) Int. Cl.
*H01L 29/66* (2006.01)

(52) U.S. Cl. ........ 257/343; 257/336; 257/344; 257/408; 257/E21.435; 257/E21.417; 438/283; 438/303; 438/305; 438/372; 438/514

(58) Field of Classification Search .............. 438/283, 438/301, 303, 305, 306, 372, 373, 514, FOR. 154, 438/FOR. 188; 257/336, 343, 344, 408, 257/E21.435, E29.261, E21.417
See application file for complete search history.

(56) References Cited

U.S. PATENT DOCUMENTS

| | | | | |
|---|---|---|---|---|
| 5,407,844 A * | 4/1995 | Smayling et al. | ............. | 438/234 |
| 6,897,525 B1 * | 5/2005 | Kikuchi et al. | ............... | 257/343 |
| 7,180,133 B1 * | 2/2007 | Vashchenko et al. | ......... | 257/343 |
| 7,781,848 B2 * | 8/2010 | Ito et al. | ........................ | 257/407 |
| 7,812,393 B2 * | 10/2010 | Williams et al. | .............. | 257/335 |
| 7,872,289 B2 * | 1/2011 | Noguchi et al. | .............. | 257/296 |
| 8,076,725 B2 * | 12/2011 | Fujii | ............................. | 257/335 |
| 2005/0041070 A1 * | 2/2005 | Chen et al. | ...................... | 347/63 |
| 2008/0258215 A1 * | 10/2008 | Tornblad et al. | .............. | 257/343 |
| 2011/0156142 A1 * | 6/2011 | Teo et al. | ...................... | 257/336 |

* cited by examiner

*Primary Examiner* — N Drew Richards
*Assistant Examiner* — Joannie A Garcia
(74) *Attorney, Agent, or Firm* — Haynes and Boone, LLP

(57) ABSTRACT

The present disclosure provides a semiconductor device having a transistor. The transistor includes a substrate and first and second wells that are disposed within the substrate. The first and second wells are doped with different types of dopants. The transistor includes a first gate that is disposed at least partially over the first well. The transistor further includes a second gate that is disposed over the second well. The transistor also includes source and drain regions. The source and drain regions are disposed in the first and second wells, respectively. The source and drain regions are doped with dopants of a same type.

20 Claims, 10 Drawing Sheets

METHOD AND APPARATUS OF FORMING A GATE

TECHNICAL FIELD

The present disclosure relates generally to a method of fabricating a semiconductor device, and more particularly, to a method of forming a gate of a semiconductor device.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

The decreased geometry size leads to challenges in fabricating a type of transistor device known as a laterally diffused MOS transistor (LDMOS), which is an asymmetric power metal-oxide-semiconductor field-effect transistor (MOSFET) that is designed for low on-resistance coupled with high blocking voltage ability. The high blocking voltage ability of the LDMOS transistor can be achieved through a formation of a resistive path, which serves as a voltage drop in the channel region of the LDMOS transistor. Existing technologies use lightly doped source and drain regions to define the resistive path. As such, the resistive path is very shallow, particularly as the geometry sizes continue to shrink. The shallow resistive path may not offer resistance as high as desired for the LDMOS transistor. Further, the shrinking geometry sizes present challenges for accurate alignment and overlay control in fabricating the LDMOS transistor.

Therefore, while existing methods of fabricating LDMOS transistors have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

SUMMARY

Figure 1:
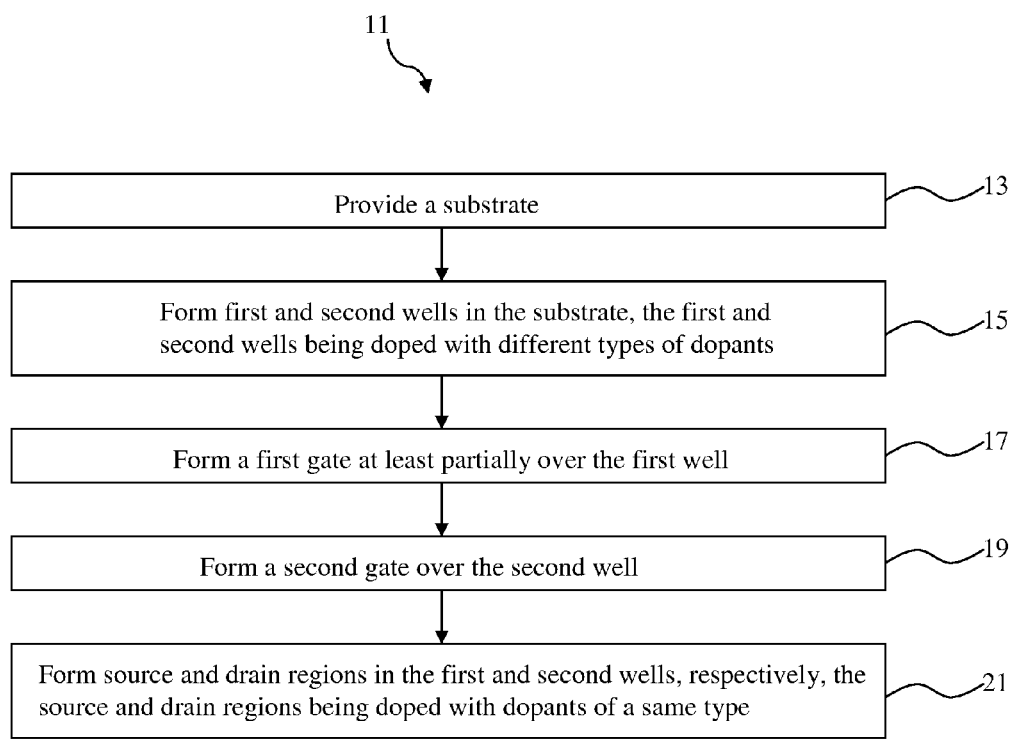
FIG. 1 is a flowchart illustrating a method of forming a gate of a semiconductor device according to various aspects of the present disclosure.

One of the broader forms of the present disclosure involves a semiconductor device that includes a transistor. The transistor includes, a substrate; first and second wells disposed within the substrate, the first and second wells being doped with different types of dopants; a first gate disposed at least partially over the first well; a second gate disposed over the second well; and source and drain regions disposed in the first and second wells, respectively, the source and drain regions being doped with dopants of a same type.

Another of the broader forms of the present disclosure involves a semiconductor device that includes a transistor. The transistor includes, a substrate; first and second wells disposed within the substrate, the first and second wells having opposite doping polarities; first and second gates disposed over a region of the first well and a region of the second well, respectively, the first and second gates being separated by a gap; and source and drain regions disposed in the first and second wells, respectively, the source and drain regions having the same doping polarity; wherein the first gate is disposed between the source region and the gap, and wherein the second gate is disposed between the drain region and the gap.

Still another of the broader forms of the present disclosure involves a method of fabricating a semiconductor device. The method includes, providing a substrate; forming first and second wells in the substrate, the first and second wells being doped with different types of dopants; forming a first gate at least partially over the first well; forming a second gate over the second well; and forming source and drain regions in the first and second wells, respectively, the source and drain regions being doped with dopants of a same type.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flowchart of a method 11 for fabricating a semiconductor device. The method 11 begins with block 13 in which a substrate is provided. The method 11 continues with block 15 in which first and second wells are formed in the substrate. The first and second wells are doped with different types of dopants. The method 11 continues with block 17 in which a first gate is formed at least partially over the first well. The method 11 continues with block 19 in which a second gate is formed over the second well. The method 11 continues with block 21 in which source and drain regions are formed in the first and second wells, respectively. The source and drain regions are doped with dopants of a same type.

FIGS. 2-9 are diagrammatic fragmentary cross-sectional side views of a LDMOS device 40A at various stages of fabrication in accordance with the method 11 of FIG. 1. FIG. 10 is a diagrammatic fragmentary cross-sectional side view of a LDMOS device 40B at a stage of fabrication in accordance with an alternative embodiment of the method 11 of FIG. 1. It is understood that FIGS. 2-10 have been simplified for a better understanding of the inventive concepts of the present disclosure. Accordingly, it should be noted that additional processes may be provided before, during, and after the method 11 of FIG. 1, and that some other processes may only be briefly described herein.

In the present embodiment, the semiconductor device is an N-type laterally diffused MOS transistor (LDMOS). It is understood that a P-type LDMOS device may be formed in an alternative embodiment. Referring back to FIG. 2, the N-type LDMOS is designated at 40. The LDMOS device 40 includes a substrate 45. The substrate 45 is a silicon substrate that is doped with a P-type dopant such as boron. In another embodiment, the substrate 45 is a silicon substrate that is doped with an N-type dopant such as arsenic or phosphorous.

Isolation structures 50 and 51 are formed in the substrate. In an embodiment, the isolation structures 50 and 51 are shallow trench isolation (STI) structures that each include a dielectric material, which may be silicon oxide or silicon nitride. In between the isolation structures 50 and 51, a p-well 60 and an n-well 61 are formed in the substrate 45. The p-well 60 is doped with a P-type dopant such as boron, and the n-well 61 is doped with an N-type dopant such as arsenic or phosphorous.

Gate stacks 70 and 71 are then formed over the substrate 45. The gate stacks 70 and 71 include respective gate dielectric layers 80 and 81. In an embodiment, the gate dielectric layers 80 and 81 each include silicon oxide. In another embodiment, the gate dielectric layers 80 and 81 each include a high-k dielectric material. A high-k dielectric material is a material having a dielectric constant that is greater than a dielectric constant of $SiO_2$, which is approximately 4. For example, the high-k dielectric material may include hafnium oxide ($HfO_2$), which has a dielectric constant that is in a range from approximately 18 to approximately 40. Alternatively, the high-k material may include one of $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, or combinations thereof.

The gate stacks 70 and 71 also include respective gate electrode layers 90 and 91 that are respectively disposed over the gate dielectric layers 80 and 81. The gate electrode layers 90 and 91 each include polysilicon. The gate stacks 70 and 71 further include respective hard mask layers 100 and 101 that are respectively disposed over the gate electrode layers 90 and 91. The hard masks 100 and 101 each include a dielectric material, such as silicon oxide or silicon nitride. Although not illustrated herein, the hard mask layers 100 and 101 were formed by patterning a hard mask material with a patterned photoresist layer. The hard mask layers 100 and 101 were then used to pattern the gate electrode layers 90-91 and the gate dielectric layers 80-81 below so as to form the gate stacks 70 and 71.

Figure 2:
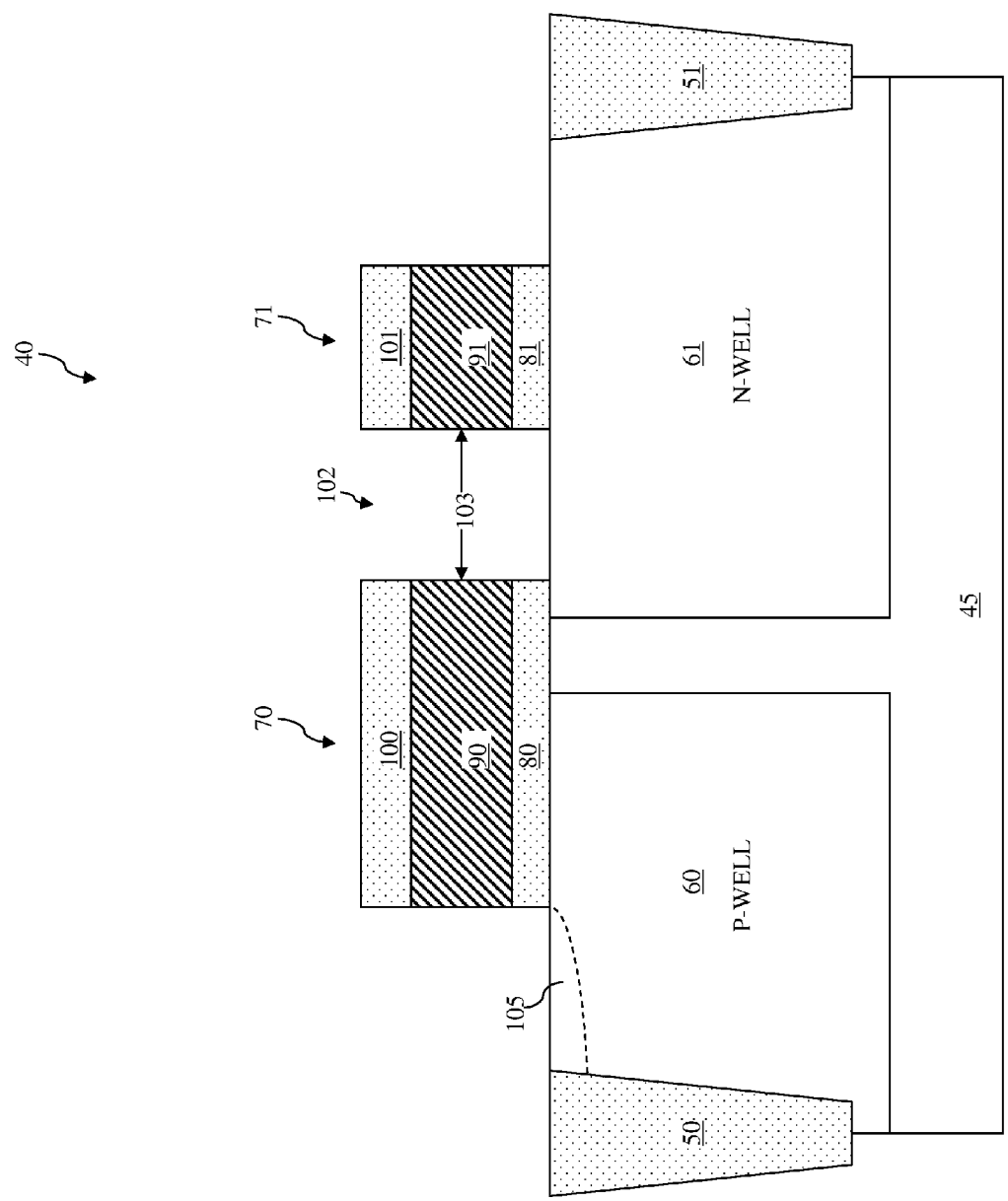
FIGS. 2-9 are diagrammatic fragmentary cross-sectional side views of the semiconductor device at various stages of fabrication in accordance with an embodiment of the method of FIG. 1.

As FIG. 2 illustrates, a portion of the gate stack 70 is formed over the p-well 60, and another portion of the gate stack 70 is formed over the n-well 61. The gate stack 71 serves as a dummy gate for reasons that will be discussed below and is formed over the n-well 61. The gate stacks 70 and 71 are separated by a gap region 102 having a distance 103. After the gate stacks 70 and 71 are formed, an N-type lightly doped source region 105 is formed in the p-well 60. The lightly doped source region is doped with an N-type dopant such as arsenic or phosphorous in an ion implantation process or a diffusion process known in the art.

Figure 3:
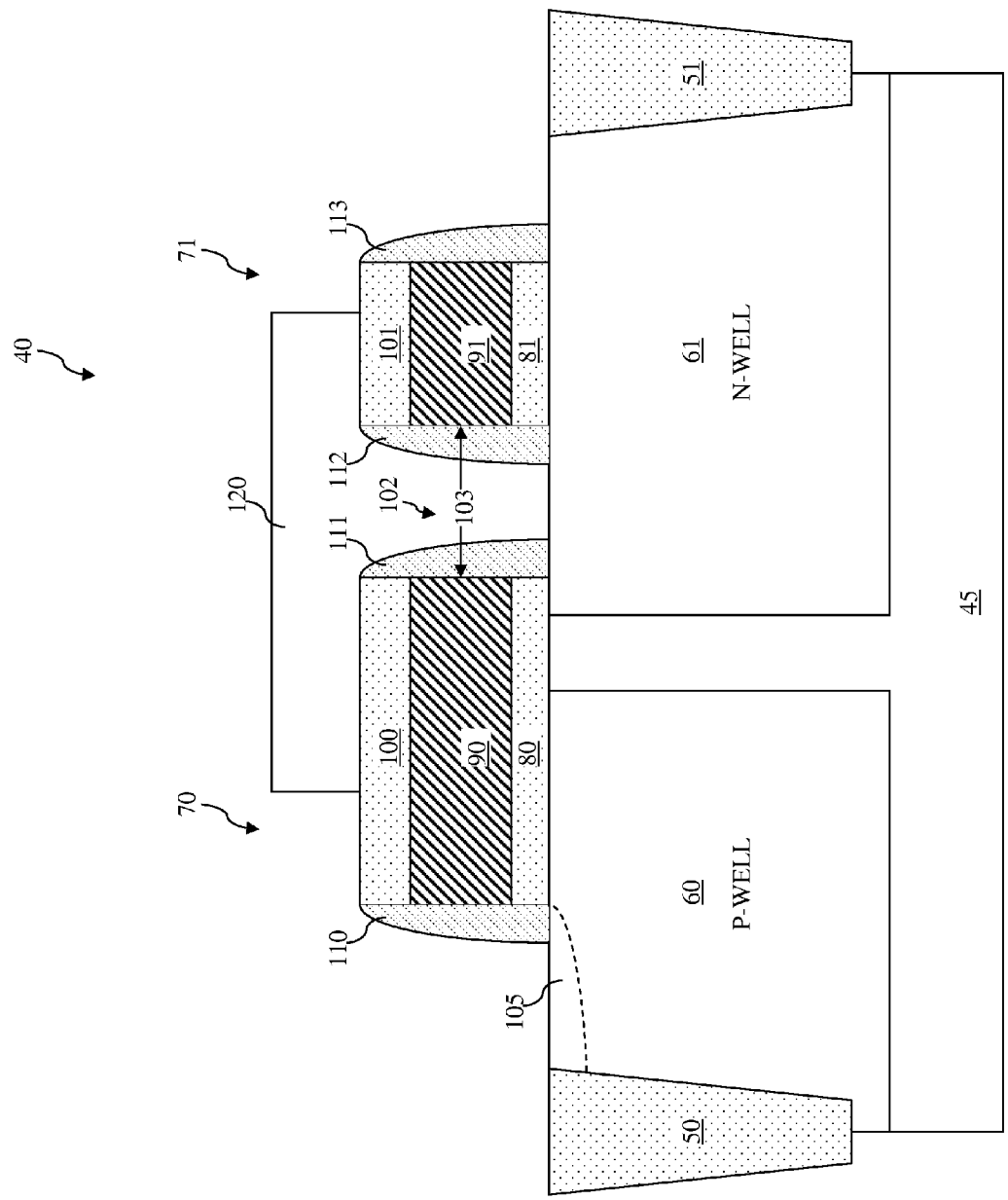

Referring now to FIG. 3, gate spacers 110 and 111 are formed on sidewalls of the gate stack 70, and gate spacers 112 and 113 are formed on sidewalls of the gate stack 71. The gate spacers 110 and 111 may also be considered to be a part of the gate stack 70, and the gate spacers 112 and 113 may also be considered to be a part of the gate stack 71. The gate spacers 110-113 are formed using a deposition process and an etching process (for example, an anisotropic etching process) known in the art. The gate spacers 110-113 include a suitable dielectric material such as silicon nitride, silicon oxide, silicon carbide, silicon oxy-nitride, or combinations thereof. Thereafter, a photoresist mask 120 is formed over the substrate 45. The photoresist mask 120 is formed by forming a photoresist layer over the substrate 45 and patterning the photoresist layer into the photomask 120 in a lithography process known in the art. As is shown in FIG. 3, the photoresist mask 120 is disposed over a portion of the gate stack 70 and a portion of the gate stack 71, and fills the gap region 102. The purpose of the photoresist mask 120 is to protect regions of the n-well 61 underneath the gap region 102 from being doped by dopants in a later implantation (or doping) process.

Figure 4:
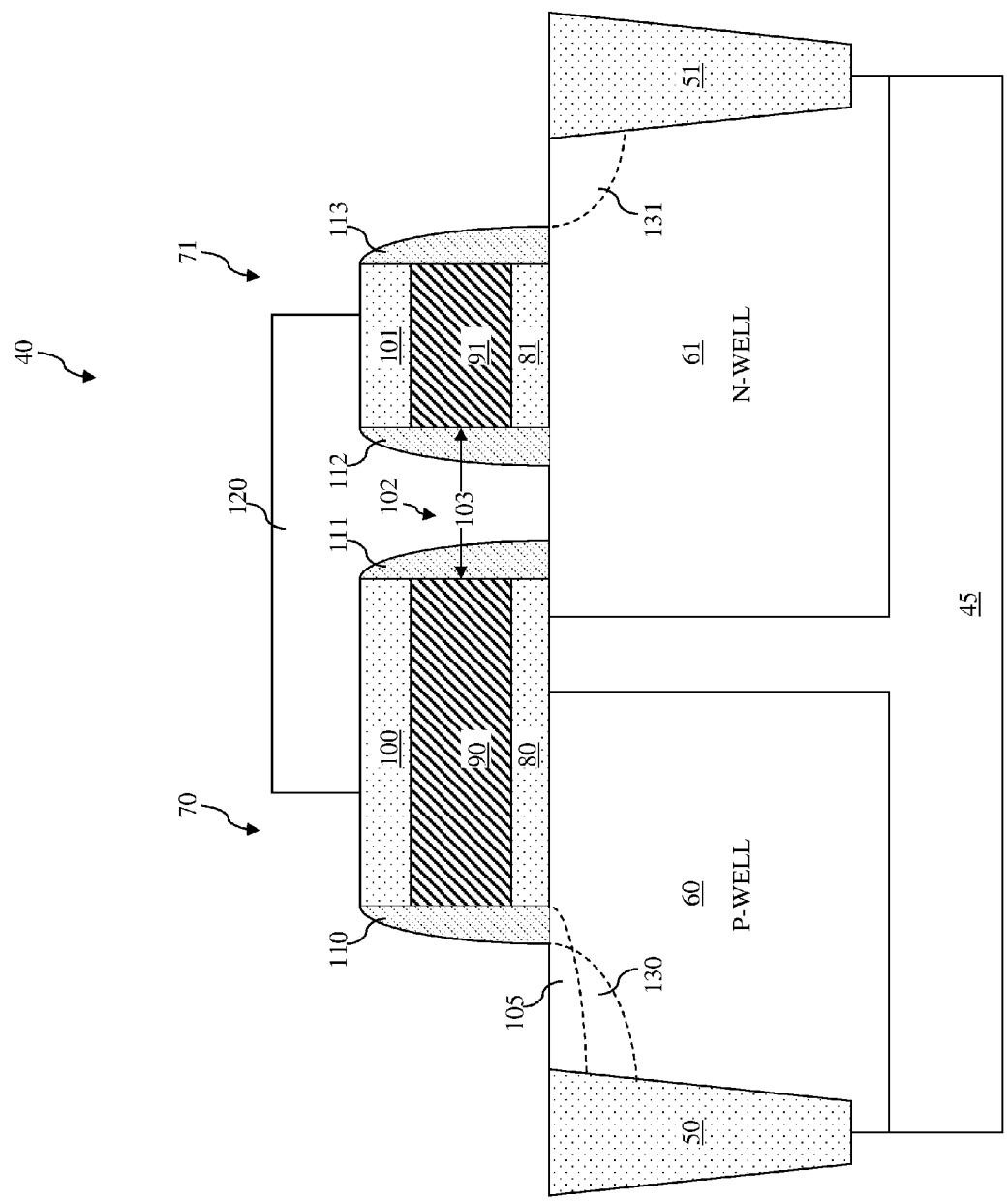

Referring now to FIG. 4, a heavily doped source region 130 and a heavily doped drain region 131 are formed in the p-well 60 and the n-well 61, respectively. The heavily doped source and drain regions 130 and 131 may be formed by an ion implantation process or a diffusion process known in the art. The source and drain regions 130 and 131 may also be referred to as active regions. The source and drain regions 130 and 131 are each doped with an N-type dopant such as arsenic or phosphorous. Since the dopants cannot penetrate through the gate stacks 70 and 71 and the spacers 110-113 around the gate stacks, the source region 130 is formed to be self-aligned with the gate spacer 110 of the gate stack 70, and the drain region 131 is formed to be self-aligned with the gate spacer 113 of the gate stack 71. As discussed above, the photoresist mask 120 protects regions of the n-well 61 therebelow from being implanted in this ion implantation process.

Traditional methods of forming an LDMOS device do not include the forming of the gate stack 71. As such, the traditional methods rely on using a photoresist mask to accurately define an area of the drain region of the LDMOS device. This places burdens on the photolithography process used to form the photoresist mask and may lead to undesirable results. Here, the formation of the gate stack 71 allows the drain region 131 to be formed in a self-aligning fashion, such that the edge of the drain region is aligned with the edge of the gate spacer 113. The photoresist mask 120 is used to protect the regions of the n-well 61 below the gap region 102 from being doped but is no longer used to define the area of the drain region 131. Consequently, the overlay requirements of the photoresist mask 120 is looser—it can be formed to be a little bit wider or narrower, and that would not impact the area of the drain region 131, as long as the edges of photoresist mask 120 are formed to be "within" the gate stacks 70 and 71. In addition, in a semiconductor fabrication process, the fabrication stage where the gate stacks 70 and 71 are formed typically has the best overlay control, as compared to the overlay control of other fabrication stages. In the embodiment shown in FIG. 4, the dummy gate stack 71 is used to define the area of the drain region 131. Since the overlay control is relatively good in the fabrication stage where the dummy gate stack 71 is formed, the exact area or size of the drain region 131 can be more accurately controlled than if a photoresist mask had been used to define the area of the drain region 131.

Figure 5:
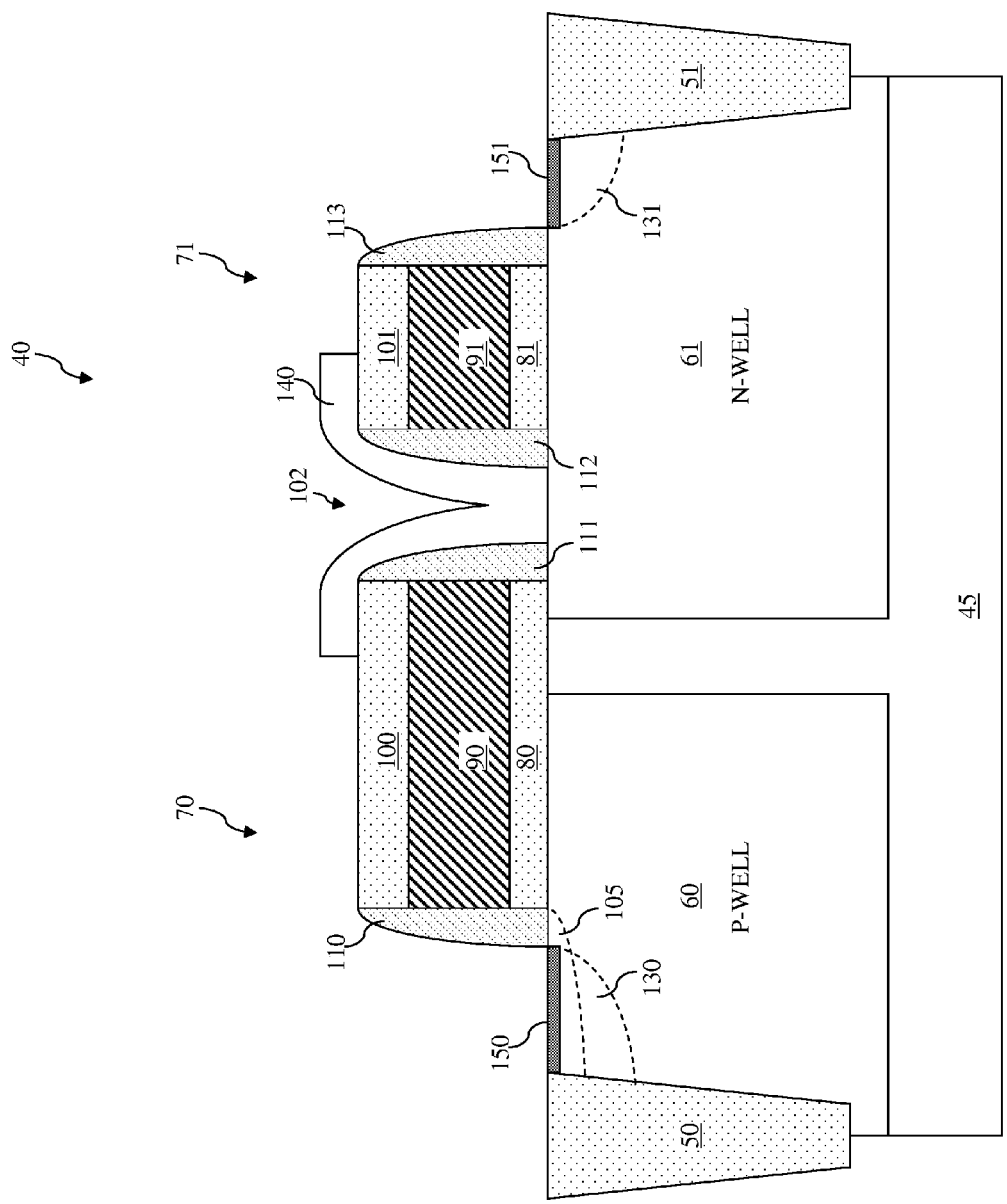

Referring now to FIG. 5, the photoresist mask 120 is removed in a stripping or ashing process known in the art. Thereafter, a patterned resist protection oxide (RPO) layer 140 is formed to partially fill the gap region 102. The patterned RPO layer 140 is formed by depositing a layer of RPO material over the substrate 45 and the gate stacks 70 and 71 and patterning the RPO material with a patterned photoresist (not illustrated) in a lithography process. After being patterned by the photoresist, the patterned RPO layer 140 is disposed over the gate spacers 111-112 and partially over the gate stacks 70 and 71. A silicidation process is then performed on exposed surfaces of the substrate 45 to form self-aligned silicides (referred to as salicides) 150 and 151. The patterned RPO layer 140 and the hard masks 100 and 101 serve as silicidation masks in the silicidation process.

For reasons similar to those discussed above with reference to FIG. 4, the formation of the dummy gate stack 71 in the embodiment shown in FIG. 5 relaxes the overlay requirements of the patterned RPO layer 140. In other words, the sizes of the salicides 150 and 151 no longer depend on accurate overlay control of a photoresist mask (not illustrated).

Figure 6:
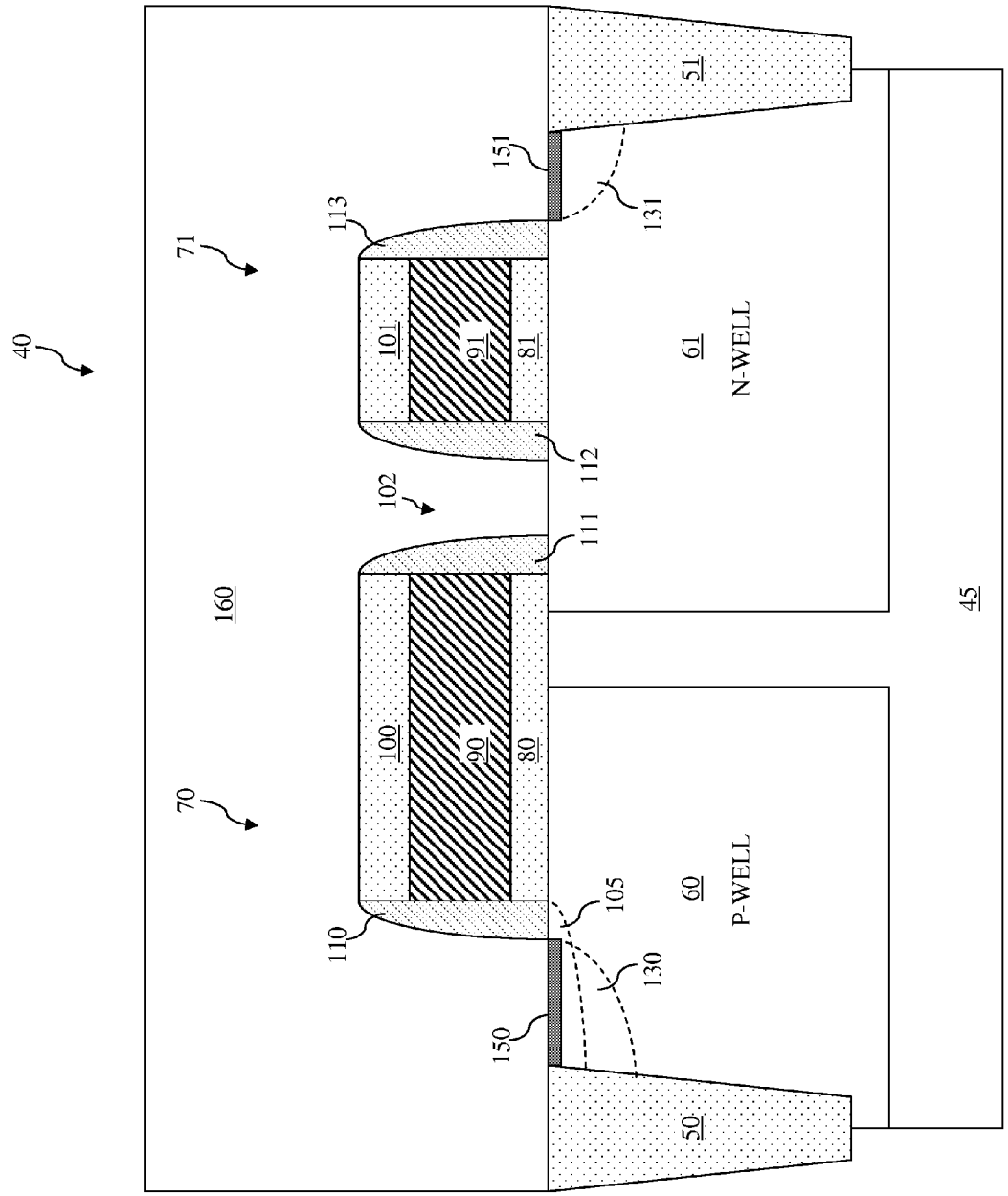

Referring now to FIG. 6, the patterned RPO layer 140 is removed, and an inter-layer (or inter-level) dielectric (ILD) layer 160 is formed over the substrate 45 and the gate stacks 70 and 71. The ILD layer 160 may be formed by chemical vapor deposition (CVD), high density plasma CVD, spin-on, sputtering, or other suitable methods. In an embodiment, the ILD layer 160 includes silicon oxide. In other embodiments, the ILD layer 160 may include silicon oxy-nitride, silicon nitride, or a low-k material.

Figure 7:
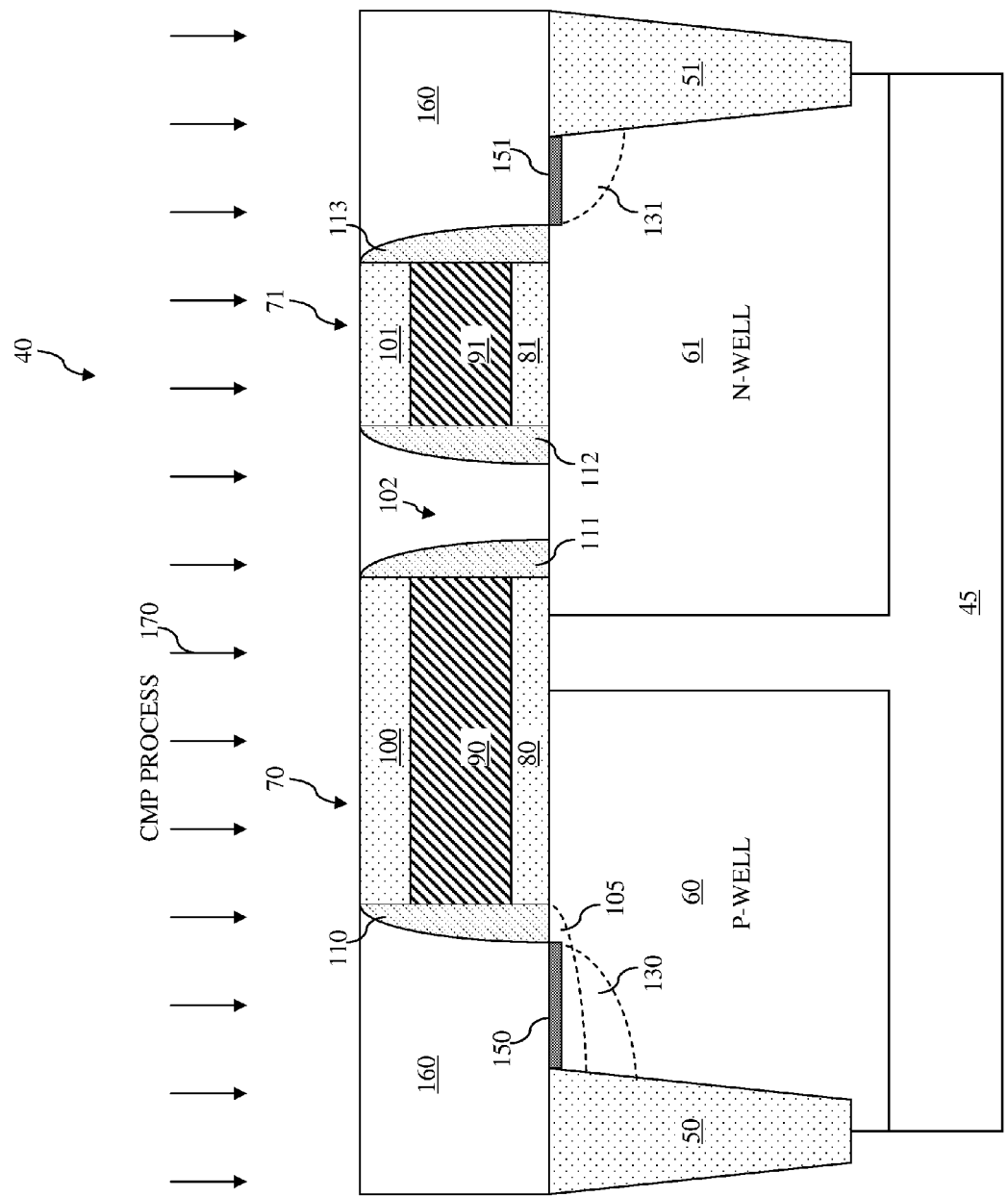

Referring to FIG. 7, a chemical-mechanical-polishing (CMP) process 170 is performed on the ILD layer 160 to expose a top surface of the gate stacks 70 and 71. In another embodiment, the patterned RPO layer 140 is not removed separately before the ILD layer 160 is formed, but is rather removed by the CMP process 170. Following the CMP process 170, the top surfaces of the gate stacks 70 and 71 are substantially co-planar with the top surface of the ILD layer 160 on either side of the gate stacks 70 and 71. As such, the hard masks 100 and 101 are exposed. Although not illustrated, one or more annealing processes are performed on the LDMOS device 40 to activate the source and drain regions 130 and 131. These annealing processes may be performed before or after the CMP process 170.

Figure 8:
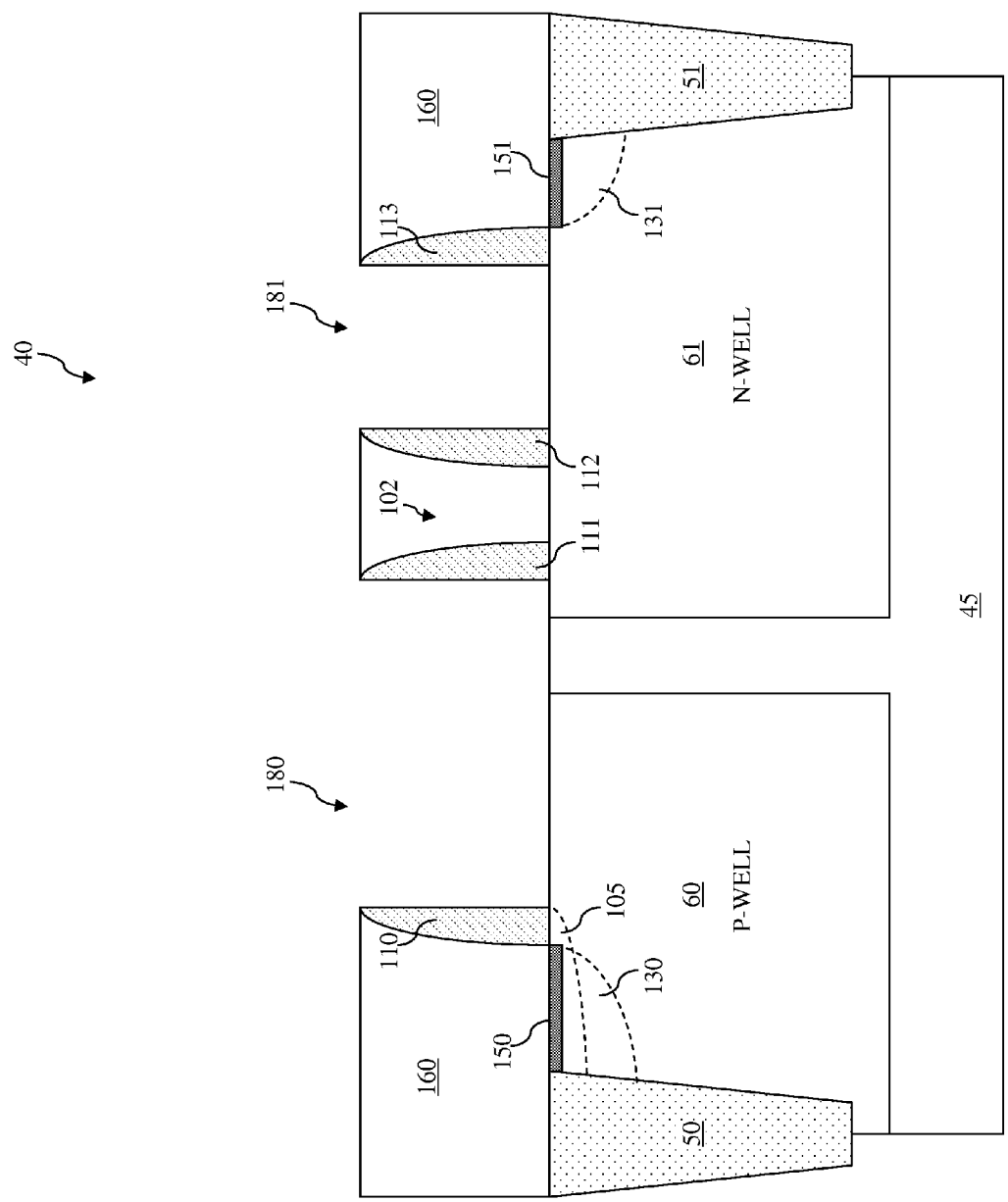

Referring now to FIG. 8, the gate stacks 70 and 71 are removed, thereby forming trenches (or openings) 180 and 181 in place of the gate stacks 70 and 71, respectively. The gate stacks 70 and 71 may be removed in a wet etching or a dry etching process known in the art, while the rest of the layers of the LDMOS device 40 remain substantially un-etched, including the gate spacers 110-113 and the ILD layer 160. This is performed in accordance with a "high-k last" process. In an alternative embodiment, the gate dielectric layers 80 and 81 each include the high-k dielectric material (instead of silicon oxide) as discussed above and are not removed. This alternative embodiment is performed in accordance with a "gate-last" process and will be illustrated in a later Figure.

Figure 9:
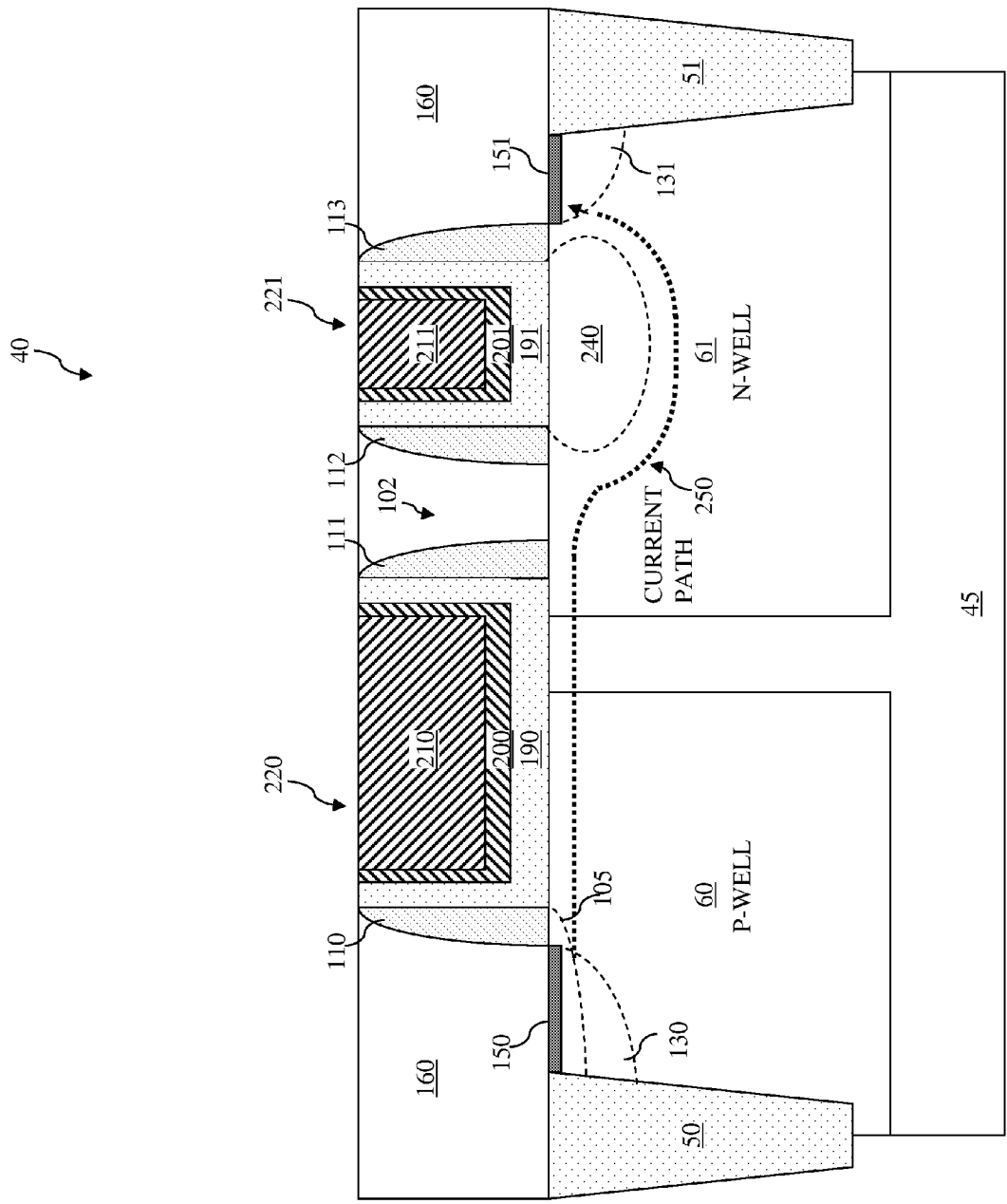
Figure 10:
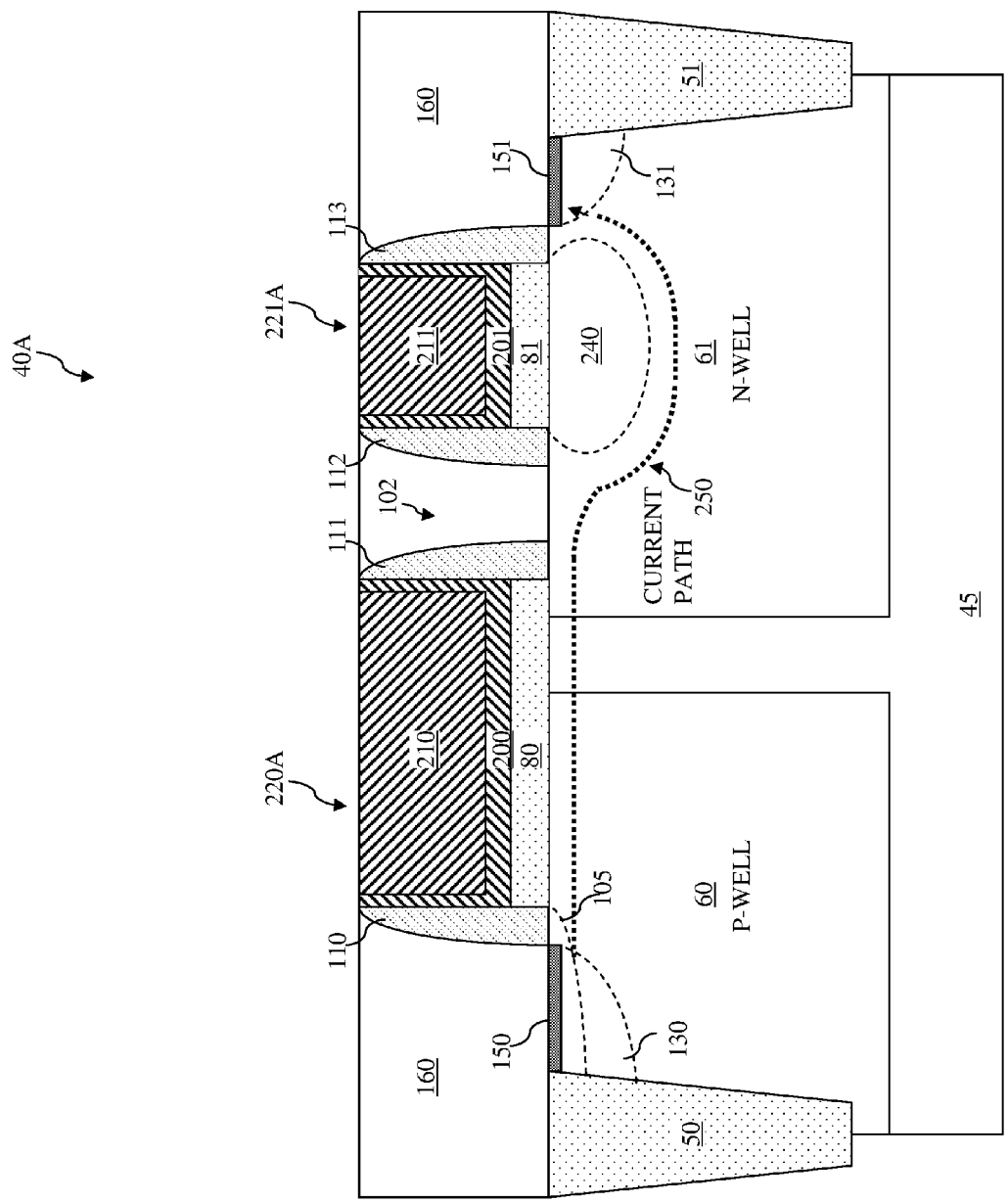
FIG. 10 is a diagrammatic fragmentary cross-sectional side view of the semiconductor device at a stage of fabrication in accordance with an alternative embodiment of the method of FIG. 1.

Referring now to FIG. 9, high-k gate dielectric layers 190 and 191 are formed in the trenches 180 and 181, respectively. The high-k gate dielectric layers 190 and 191 each include the high-k dielectric material as discussed above. Although not illustrated, it is understood that an interfacial layer may be formed in the trenches 180 and 181 before the high-k gate dielectric layers 190 and 191 are formed.

Conductive layers 200 and 201 are formed within the trenches 180 and 181 and over the high-k gate dielectric layers 190 and 191. The conductive layer 200 includes an N-type work function metal (N-metal), which may be Ti, Al, Ta, $ZrSi_2$, TaN, or combinations thereof. The conductive layer 201 includes a P-type work function metal (P-metal), which may be Mo, Ru, Jr, Pt, PtSi, MoN, WNx, or combinations thereof. Each of the N-metals and each of the P-metals has a respective range of work functions values associated therein. The conductive layers 200 and 201 may be formed by CVD, physical vapor deposition (PVD), or another suitable technique. Thereafter, conductive layers 210 and 211 are formed within the trenches 180 and 181 and over the conductive layers 200 and 201, respectively. The conductive layers 210 and 211 each include one of tungsten (W), Aluminum (Al), copper (Cu), and combinations thereof. The conductive layers 210 and 211 may be formed by CVD, PVD, plating, or another suitable technique.

A gate structure 220 (or gate stack) is formed by the conductive layers 200 and 210 and the high-k gate dielectric layer 190, and a dummy gate structure 221 (or gate stack) is formed by the conductive layers 211 and 201 and the high-k gate dielectric layer 291. The conductive layers 200 and 210 together constitute the gate electrode portion of the gate structure 220, and the conductive layers 201 and 211 together constitute the dummy gate electrode portion of the dummy gate structure 221.

The conductive layer 200 tunes a work function of the LDMOS device 40 so that a desired threshold $V_t$ voltage is achieved. Thus, the conductive layer 200 may also be referred to as a work function metal layer. The conductive layer 210 serves as the main conductive portion of the gate electrode 220 and may be referred to as a fill metal layer.

The conductive layer 201 of the dummy gate electrode 221 induces a depletion region 240 below the gate electrode 221 in the n-well 61. The dimensions or size of the depletion region 240 is correlated with the material composition of the conductive layer 201, since each material composition is associated with a different work function value (or range of values). For example, in an embodiment where the conductive layer 201 includes Mo, the work function value of the conductive layer is at a range between about 4.5 to about 4.9. In another embodiment where the conductive layer 201 includes Pt, the work function value of the conductive layer is at a range between about 5.2 to about 5.6. The width and/or depth of the depletion region 240 varies in accordance with the work function values of the conductive layer 201. Alternatively stated, the dimension or size of the depletion region 240 is a function of the material composition of the conductive layer 201.

The depletion region 240 is substantially free of charge carriers, thus leaving none to carry an electrical current. Thus, due to the presence of the depletion 240, a current path 250—the path of current flow from the source region 105 to the drain region 131—is extended in a manner so that the current flows "around" the depletion region 240. The extended current path 250 effectively increases a resistance of a resistive path between the source region 130 and the drain region 131. A portion of a gate-drain voltage (Vgd) is allocated to the resistive path between the source region 130 and the drain region 131. In other words, the resistive path acts as a voltage drop in the channel region. To optimize the performance of the LDMOS device 40, it is desirable to allocate a greater portion of the Vgd to this resistive path (or to have a greater voltage drop), which may be accomplished by increasing the resistance of the resistive path. Existing technologies increase the resistance of the resistive path by "moving" the drain region 131 further away from the source region 130, which increases the size of the LDMOS device 40 and is therefore undesirable. In comparison, the embodiment illustrated in FIG. 9 offers the advantage of increased resistance of the resistive path without having to increase the size of the LDMOS device 40.

The present embodiment discussed above with reference to FIGS. 2-9 also offers other advantages, it being understood that different embodiments may offer different advantages, and that no particular advantage is required for all embodiments. One of the other advantages is that, as discussed above with references to FIGS. 4 and 5, the present embodiment's use of the dummy gate relaxes the stringent overlay requirements associated with existing technologies. Another advantage of the present embodiment is that the fabrication processes are compatible with a conventional high-k metal gate replacement gate process flow, thus implementing the present embodiment requires no additional costs.

FIG. 10 is a fragmentary diagrammatic cross-sectional side view of the alternative "gate-last" embodiment of the method 11 of FIG. 1 mentioned above. In the "gate-last" embodiment, the gate dielectric layers 80 and 81 include the high-k dielectric material and would not have been removed when the gate electrode layers 90 and 91 was removed to form trenches 180A and 181A, thus the high-k gate dielectric layers 190 and 191 (FIG. 9) need not be formed in the alternative embodiment. After the removal of the gate electrode layers 90 and 91, the conductive layers 200 and 210 are formed in the trenches 180A and 181A, and thereafter the materials outside the trenches are removed in a CMP process. A gate structure 220A is formed by the gate dielectric layer 80 and the conductive layers 200 and 210, and a dummy gate structure 221A is formed by the gate dielectric layer 81 and the conductive layers 201 and 211. The dummy gate structure 221A induces the depletion region 240 underneath for reasons similar to the high-k last embodiment discussed above with reference to FIGS. 2-10, and as such has similar advantages.

It is understood that additional processes may be performed to complete the fabrication of the LDMOS device 40. For example, these additional processes may include deposition of passivation layers, formation of contacts, and formation of interconnect structures (e.g., lines and vias, metal layers, and interlayer dielectric that provide electrical interconnection to the device including the formed metal gate). For the sake of simplicity, these additional processes are not described herein.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, the high voltage device may not be limited to an NMOS device and can be extended to a PMOS device with a similar structure and configuration except that all doping types may be reversed and dimensions are modified according to PMOS design. Further, the PMOS device may be disposed in a deep n-well pocket for isolating the device.

What is claimed is:

1. A semiconductor device, comprising a transistor that includes:
   a substrate;
   first and second wells disposed within the substrate, the first and second wells being doped with different types of dopants, wherein the first and second wells are separated by a portion of the substrate;
   a first gate disposed at least partially over the first well;
   a second gate disposed over the second well, wherein the second gate is different and separate from the first gate, and wherein the second gate does not extend beyond the second well; and
   source and drain regions disposed in the first and second wells, respectively, the source and drain regions being doped with dopants of a same type.

2. The device of claim 1, wherein the source region and the second gate are disposed on opposite sides of the first gate, and wherein the drain region and the first gate are disposed on opposite sides of the second gate, and wherein the second gate is a dummy gate.

3. The device of claim 1, wherein the first gate is disposed partially over the second well.

4. The device of claim 1, wherein the first gate includes a first metal, and the second gate includes a second metal that is of a different type than the first metal.

5. The device of claim 1, wherein the first and second gates each include a gate stack and gate spacers formed on either side of the gate stack, wherein the source region is approximately aligned with one of the gate spacers of the first gate, and wherein the drain region is approximately aligned with one of the gate spacers of the second gate.

6. The device of claim 1, wherein the transistor is a laterally diffused MOS transistor.

7. The device of claim 1, further including a depletion region that is disposed below the second gate, wherein a size of the depletion region is correlated with a material composition of the second gate.

8. A semiconductor device, comprising a transistor that includes:
   a substrate;
   first and second wells disposed within the substrate, the first and second wells having opposite doping polarities, wherein the first and second wells are not contiguous with each other;
   first and second gates disposed over a region of the first well and a region of the second well, respectively, the first and second gates being separated by a gap, wherein the first gate is also disposed partially over the second well; and
   source and drain regions disposed in the first and second wells, respectively, the source and drain regions having the same doping polarity;
   wherein the first gate is disposed between the source region and the gap, and wherein the second gate is disposed between the drain region and the gap.

9. The device of claim 8, wherein the first and second gates each include a gate stack and gate spacers formed on either side of the gate stack, wherein the source region is approximately aligned with one of the gate spacers of the first gate, and wherein the drain region is approximately aligned with one of the gate spacers of the second gate.

10. The device of claim 9, wherein the source and drain regions each include a silicide surface, and wherein the first and second gate stacks respectively include first and second high-k gate dielectrics and first and second metal gate electrodes, and wherein the second gate is a dummy gate.

11. The device of claim 10, wherein the first gate electrode includes a work function metal of a first type, and the second gate electrode includes a work function metal of a second type that is opposite the first type, and wherein the transistor further includes a depletion region that is disposed underneath the second gate, wherein a dimension of the depletion region is correlated with a material composition of the work function metal of the second gate electrode.

12. A method of fabricating a semiconductor device, comprising:
   providing a substrate;

forming first and second wells in the substrate, the first and second wells being doped with different types of dopants;

forming a first gate at least partially over the first well and partially over the second well;

forming a second gate over the second well, wherein the second gate is a dummy gate and does not extend beyond the second well; and forming source and drain regions in the first and second wells, respectively, the source and drain regions being doped with dopants of a same type.

13. The method of claim 12, wherein the forming the source and drain regions is carried out so that the source region and the second gate are disposed on opposite sides of the first gate, and the drain region and the first gate are disposed on opposite sides of the second gate.

14. The method of claim 12, wherein the first well and the second well are not touching each other.

15. The method of claim 12, wherein the forming the first and second gates is carried out in a manner so that the first and second gates respectively include a first metal and a second metal, the first metal being a different type than the second metal.

16. The method of claim 15, wherein the forming the second gate is carried out in a manner so that the metal of the second gate is selected so as to induce a depletion region to be formed below the second gate.

17. The method of claim 12, wherein the forming the first and second gates includes:

forming first and second gate stacks; and forming first and second gate spacers on either side of the first and second gate stacks, respectively;

wherein the forming the source and drain regions is carried out so that the source region is approximately aligned with one of the first gate spacers, and the source region is approximately aligned with one of the second gate spacers.

18. The method of claim 12, wherein the forming the first and second gates is carried out so that the first and second gates are interposed by a gap region, and further including:

before the forming the source and drain regions, filling the gap region with a photoresist mask;

removing the photoresist mask;

after the forming the source and drain regions, forming a dielectric material in the gap region;

performing a silicidation process on the source and drain regions, the dielectric material serving as a protective mask in the silicidation process; and removing the dielectric material.

19. The method of claim 12, wherein the forming the first and second gates is carried out so that the first and second gates each include a polysilicon material, and further including:

removing the first and second gates, thereby forming first and second openings in place of the first and second gates, respectively;

forming first and second high-k gate dielectrics in the first and second openings, respectively; and forming first and second metal gate electrodes over the first and second gate high-k gate dielectrics, respectively.

20. The method of claim 12, wherein the forming the first and second gates is carried out so that the first and second gates respectively include first and second high-k gate dielectrics and first and second polysilicon gate electrodes, and further including:

removing the first and second polysilicon gate electrodes, thereby forming first and second openings in place of the first and second polysilicon gate electrodes, respectively; and forming first and second metal gate electrodes in the first and second openings over the first and second high-k gate dielectrics, respectively.

* * * * *